(12) United States Patent
Poidl

(10) Patent No.: US 7,863,528 B2
(45) Date of Patent: Jan. 4, 2011

(54) HOUSING WITH THERMAL BRIDGE

(75) Inventor: Jurgen Poidl, Kocherstetten (DE)

(73) Assignee: R. Stahl Schaltgerate GmbH, Waldenburg (DE)

( * ) Notice: Subject to any disclaimer, the term of this patent is extended or adjusted under 35 U.S.C. 154(b) by 191 days.

(21) Appl. No.: 12/293,725

(22) PCT Filed: Nov. 28, 2006

(86) PCT No.: PCT/EP2006/011396
§ 371 (c)(1),
(2), (4) Date: Oct. 22, 2008

(87) PCT Pub. No.: WO2007/107178
PCT Pub. Date: Sep. 27, 2007

(65) Prior Publication Data
US 2010/0170714 A1    Jul. 8, 2010

(30) Foreign Application Priority Data
Mar. 20, 2006   (DE)   .................. 10 2006 013 017

(51) Int. Cl.
*H05K 7/20*    (2006.01)
(52) U.S. Cl. ................ 174/548; 257/717; 257/718; 361/707; 361/709
(58) Field of Classification Search .......... 257/717, 257/718; 361/707, 709; 174/548
See application file for complete search history.

(56) References Cited

U.S. PATENT DOCUMENTS

| | | | |
|---|---|---|---|
| 5,812,375 A | 9/1998 | Casperson | |
| 6,088,226 A * | 7/2000 | Rearick | 361/704 |
| 6,212,074 B1 * | 4/2001 | Gonsalves et al. | 361/717 |
| 6,365,964 B1 * | 4/2002 | Koors et al. | 257/718 |
| 6,396,691 B1 | 5/2002 | Pagnozzi | |
| 6,400,577 B1 * | 6/2002 | Goodwin et al. | 361/816 |
| 6,404,048 B2 * | 6/2002 | Akram | 257/706 |
| 6,781,840 B2 * | 8/2004 | Ikushima et al. | 361/707 |
| 6,903,457 B2 * | 6/2005 | Nakajima et al. | 257/717 |
| 7,149,088 B2 * | 12/2006 | Lin et al. | 361/704 |
| 7,557,442 B2 * | 7/2009 | Licht | 257/720 |
| 2003/0213586 A1 | 11/2003 | Keller et al. | |
| 2004/0089941 A1 * | 5/2004 | Mamitsu et al. | 257/718 |

FOREIGN PATENT DOCUMENTS

| | | |
|---|---|---|
| DE | 102004024616 A1 | 2/2004 |
| DE | 10309100 A1 | 9/2004 |
| DE | 10357092 A1 | 7/2005 |
| WO | WO 99/27761 A | 6/1999 |

* cited by examiner

*Primary Examiner*—Hung V Ngo
(74) *Attorney, Agent, or Firm*—Leydig, Voit & Mayer, Ltd.

(57) ABSTRACT

A hermetically sealed and/or ignition protection housing is provided with heat bridges at discreet points. The heat bridges form mounting faces in the interior space of the housing and also on the outer side. Heat from the interior of the housing generated by an item on the interior mounting faces is dissipated outwardly at the corresponding points by means of the heat bridges.

19 Claims, 2 Drawing Sheets

HOUSING WITH THERMAL BRIDGE

CROSS-REFERENCE TO RELATED APPLICATIONS

This patent application is the national phase of PCT/EP2006/011396, filed Nov. 28, 2006, which claims the benefit of German Patent Application No. DE 102006013017.0, filed Mar. 20, 2006.

FIELD OF THE INVENTION

The present invention relates generally to hermetically sealed and/or ignition protective housings, and more particularly, to housings of such type which are adapted to dissipate heat outwardly from heat generating components mounted within the housing.

BACKGROUND OF THE INVENTION

Housings of the flameproof protection enclosure type Ex-d are used for accommodating electric and electronic components that themselves do not conform to any type of explosion protection regulations. Except for very narrow flashover-proof gaps in the region of mechanical lead-throughs in the housings of this type, they are hermetically sealed. The width of such gaps in Ex-d housings is such that ignition of an explosive gas mixture in the interior of the housing does not result in the release of any particles that could ignite an explosive mixture in the surroundings of the housing. The gap width is in the range of tenths of a millimeter. Accordingly, it is difficult to cool individual semiconductors having high power loss within such a housing.

OBJECTS AND SUMMARY OF THE INVENTION

It is an object of the present invention to provide a flameproof protection housing of the foregoing type which permits easy cooling of heat generating devices within the housing.

The inventive housing features an essentially hermetically sealed interior that is surrounded by housing walls. At least one of the housing walls contains a thermal bridge that makes it possible to dissipate heat outwardly from the interior. This thermal bridge includes an elevation that protrudes inwardly from the housing wall and has a mounting face for the component to be cooled. Another elevation with a mounting face for a cooling element is arranged on the outside of the housing wall such that it is aligned with the inwardly protruding elevation. By use of individual elevations on both inner and outer sides of the housing wall, the formation of the mounting faces is considerably simplified.

In order to achieve a low thermal resistance, the mounting faces for the component to be cooled and for the cooling element usually need to be planar. If the housing is made of cast iron, the surfaces naturally are relatively rough. The processing required for effecting planar mounting faces results in a material weakening at the respective location of the wall, which usually is unacceptable for reasons of explosion protection unless the remainder of the wall is formed with such excess dimensions that it remains sufficiently thick after the processing in the region of the mounting faces.

In the context of the present invention, the wall is made thicker in the region in which the thermal bridge is produced than in the remainder of the wall. This makes it possible to remove material in the region of the thermal bridge without impairing the stability or pressure resistance of the housing. This furthermore makes it possible to easily provide thermal bridges on different walls such that they are spatially separated from one another. Consequently, the cooling elements or cooling devices provided on the outside of the housing can also be spatially separated from one another in order to largely preclude a mutual impairment of the cooling effect.

Finally, forming thermal bridges by utilizing locally defined elevations on the inner and the outer wall provides the advantage of inducing a lower heat distortion in the housing wall. This is also important, particularly with respect to larger housings, because a significant distortion can cause the housing cover, under certain circumstances, to no longer satisfy the explosion requirements. The gap between the cover and the housing frame can become impermissibly large due to such a distortion. The massive and spatially concentrated thermal bridge makes it possible to effect a concentrated heat dissipation from the housing at its designated location and largely keeps the heat away from the remainder of the wall. In addition, the elevations also make it possible to eliminate an impairment caused by any type of reinforcing ribs provided on the wall.

The housing is advantageously provided with at least one essentially flat housing wall. The inventive solution is suitable for use with round housings, as well as square or cuboid housings. The housing wall containing the thermal bridge preferably consists of a material with adequate thermal conductivity. The elevations on the inner side and the outer side can then be directly formed integrally out of the wall material.

It is furthermore possible to arrange the thermal bridge in a corresponding opening in the housing wall, for example, in the form of a bolt that extends through the housing wall in a sealed fashion. Openings for this purpose may be threaded openings into which the bolt in the form of a threaded bolt is screwed and adhered to the bore thread. Instead of the adhesion, it also would be possible to insert the bolt such that an Ex gap is formed. In this case, a correspondingly designed thread may serve as the Ex gap.

Favorable conditions are achieved if the elevations have the shape of a truncated cone or a truncated pyramid. In this case, the, elevations on the inner and the outer side respectively face one another with their largest cross-sectional surface. Advantageous mounting options also are achieved if the mounting face consists of a plane face.

If a larger amount of heat needs to be transferred, it would be easily possible to arrange several of the thermal bridges adjacent to one another, wherein each thermal bridge respectively carries either a group of components or an individual component. All thermal bridges can be connected to a common cooling element on the outer side.

In order to mount the cooling element and the components, the thermal bridges may contain threaded bores in the mounting faces or plane faces, respectively. These bores preferably are in the form of blind holes in order to avoid undesirable passages in the region of the bores.

Basic embodiments of the invention are described below with reference to the figures. When reading through the description of the figures, it becomes clear that the individual characteristics of the embodiments can be arbitrarily combined with one another. A description of all subcombinations of the individual embodiments would unnecessarily inflate the volume of this application.

Figure 1:
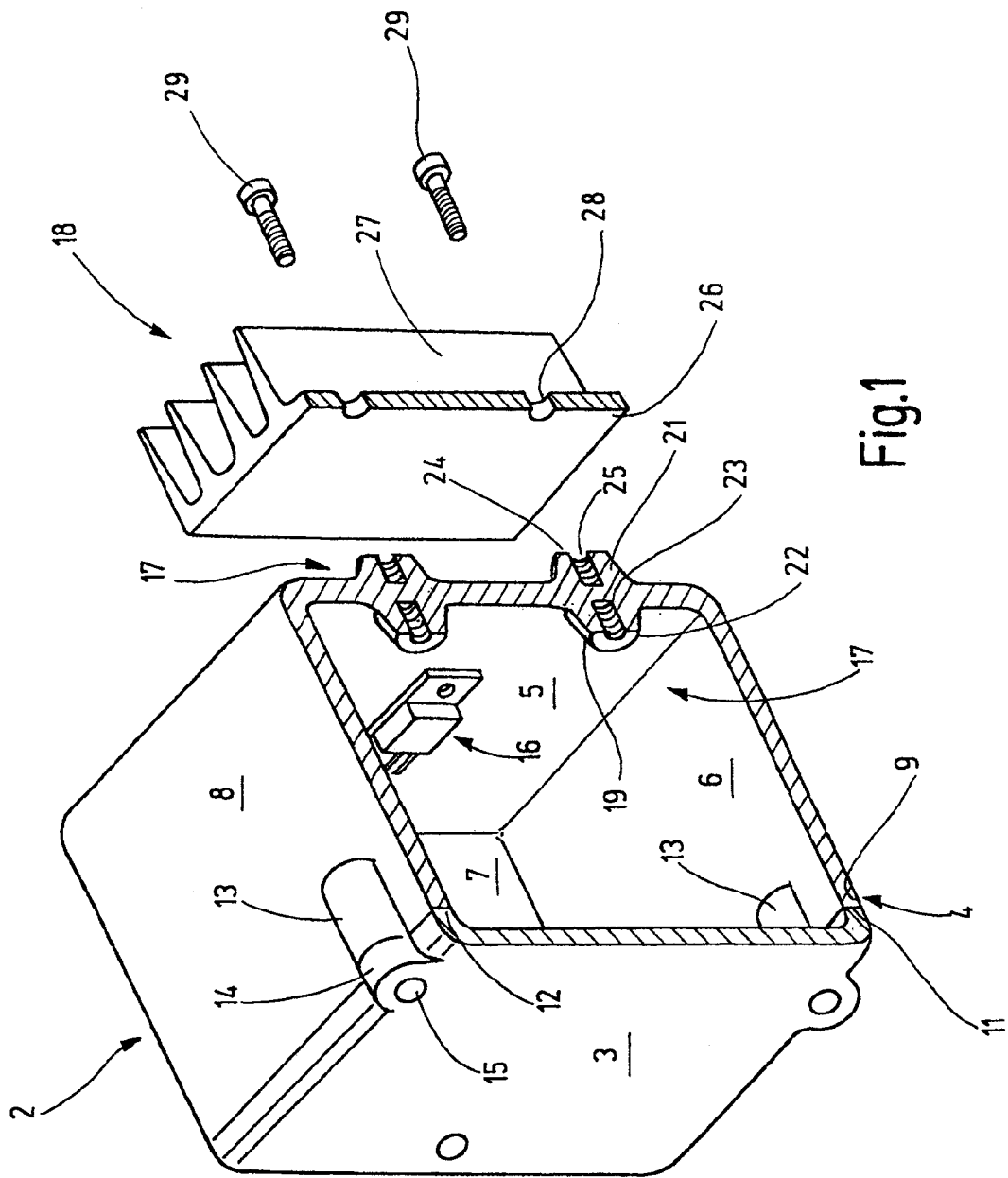
FIG. 1 is an exploded fragmentary perspective of a protective housing having thermal bridges in accordance with the invention.

While the invention is susceptible of various modifications and alternative constructions, certain illustrative embodiments thereof have been shown in the drawings and will be described below in detail. It should be understood, however, that there is no intention to limit the invention to the specific forms disclosed, but on the contrary, the intention is to cover all modifications, alternative constructions, and equivalents falling within the spirit and scope of the invention.

DESCRIPTION OF THE PREFERRED EMBODIMENTS

Referring now more particularly to FIG. 1 of the drawings, there is shown an illustrative housing of the flame proof encapsulated Ex-d type in accordance with the invention. The illustrated housing 1 includes a housing base body 2 that is closed with a cover 3. The cover 3 and contact surface on the housing base body 2 form an Ex-d type gap 4.

The housing base body 1 is formed by a housing rear wall 5 and a frame that surrounds the rear wall 5 consisting of a bottom wall 6, a housing side wall 7 (particularly visible in FIG. 1), a housing roof 8, and a second housing side wall that is cut away from view in FIG. 1 and extends parallel to the other housing side wall 7. Pairs of the individual walls respectively extend parallel to one another such that the housing base body as a whole has a cuboid shape.

The housing bottom wall 6, the two housing side walls 7 and the housing roof 8 form a closed ring-shaped cover contact surface 9, which forms one side of the Ex-d gap 4. The housing rear wall 5, the bottom wall 6 and the housing side walls 7, as well as the housing roof 8, consist of essentially planar structures with approximately parallel planar sides that face the housing interior and essentially planar faces that are directed outward.

The housing cover 3 also has essentially a shell or planar faxed shape with a contact surface 11 for mating with the housing base body 2 on its shell-shaped cover edge 11. The contact surface 12 is complementary to the cover contact surface 9 and forms the other side of the Ex-d gap 4.

In the region of the cover contact surface 9, the housing base body 2 is provided with a number of integrally cast beads 13 that extend perpendicular to the Ex-d gap 4 and correspond to complementary beads 14 or thickenings on the cover 3. These beads 13 contain threaded bores for screwing in screws that are inserted into stepped holes 15 in the beads 14 and serve for screwing the cover 3 to the housing base body 2.

The housing 1 serves to accommodate electronic components, one of which is illustrated in the form of a power transistor 16 in the SOT 220 housing. In order to dissipate heat generated from the electronic component 16 or other electronic components, several thermal bridges 17 extend through the housing wall 5 such that they are spatially separated from one another. The thermal bridges serve for thermally coupling the heat-generating components 16 to an externally mounted rib-type cooling element 18.

Each of the illustrated thermal bridges 17 is composed of a projection 19 in the shape of a truncated cone that protrudes into the housing interior and a corresponding projection 21 in the shape of a truncated cone that protrudes from the outside of the housing rear wall. The two projections 19, 21 of each thermal bridge 17, which in this case are in the shape of truncated cones, are aligned with one another in such a way that they lie on a common axis that extends perpendicular to the housing rear wall 5.

The inner projection in the shape of a truncated cone ends in a planar face 22 that serves as the mounting face for the power semiconductor 16. A threaded blind hole 23 extends through the mounting face 22. In the embodiment shown, all mounting or plateau faces 22 in the interior of the housing lie in a common plane such that it is also possible to mount larger heat-emitting components on several thermal bridges 17.

The projection 21 on the outer side also has the shape of a truncated cone and similarly has an outwardly directed mounting or planar face 24, through which a threaded blind hole 25 extends coaxially. The thermal bridges 17 on the outer side are identically formed such that the plateau faces or mounting faces 24 on the outer side also lie in the same plane. This makes it possible to utilize the cooling element 18 for several thermal bridges 17. At each thermal bridge 17, the corresponding projections in the shape of truncated cones face one another with their base surfaces.

The cooling element 18 has a plane mounting face 26 from which cooling ribs 27 extend toward the opposite side. Through-bores 28 for mounting screws 29 are situated between the corresponding cooling ribs, wherein said mounting screws serve for mounting the cooling element 18 on the two visible thermal bridges 17 shown in FIG. 1.

The illustrated thermal bridges 17, which form an integral part of a housing wall, are particularly suitable for housings that consist of a metal alloy with adequate thermal conductivity, for example, an aluminum alloy. Since the thermal bridges 17 are raised on the inner side, the plane faces or mounting faces 22 can be easily produced without weakening the housing wall during the production process. This is particularly advantageous if the housing is made of cast iron housing which is common practice with housings of this type. Due to the casting technique, such mounting faces would be rough and also have significant tolerances. In the embodiment shown, the integrally cast projections 19 in the shape of truncated cones can be readily machined on their mounting face side.

The thermal bridges 17 can be selectively located at desirable positions. It is also easily possible to form the thermal bridges 17 with mounting faces that lie in a common plane as indicated above. This makes it possible to mount large-volume heat-generating elements on several thermal bridges 17. However, it further is possible to position a thermally conductive plate on several thermal bridges 17, wherein the thermally conductive plate accommodates several individual power semiconductors 16 or other heat-generating components. The heat is transferred outward to the cooling element 18 in a concentrated fashion via the thermal bridges 17.

A similar production technique applies to the projections of thermal bridges 17 that are in the shape of truncated cones situated on the outer side. The processing of the housing is significantly simplified. Only little material needs to be removed in order to create a planar mounting face for the large cooling element 18.

The tightness of the housing is preserved because the mounting bores are in the form of blind holes. The elevations in the shape of truncated cones also facilitates the formation of blind holes with a sufficient screw-in depth.

While the invention has been described in connection with a housing of the "protection type flameproof enclosure," it should be understood that the inventive solution can also be advantageously utilized with housings of the "protection type powder filling." In that application, one also encounters the problem of having to dissipate the heat of heat-generating electronic or electric components outward. Sand is a relatively inferior thermal conductor and thermally insulates the components quite well. It is therefore correspondingly difficult to dissipate the heat of the components outwardly. However, this can be easily effected with the inventive solution.

Figure 2:
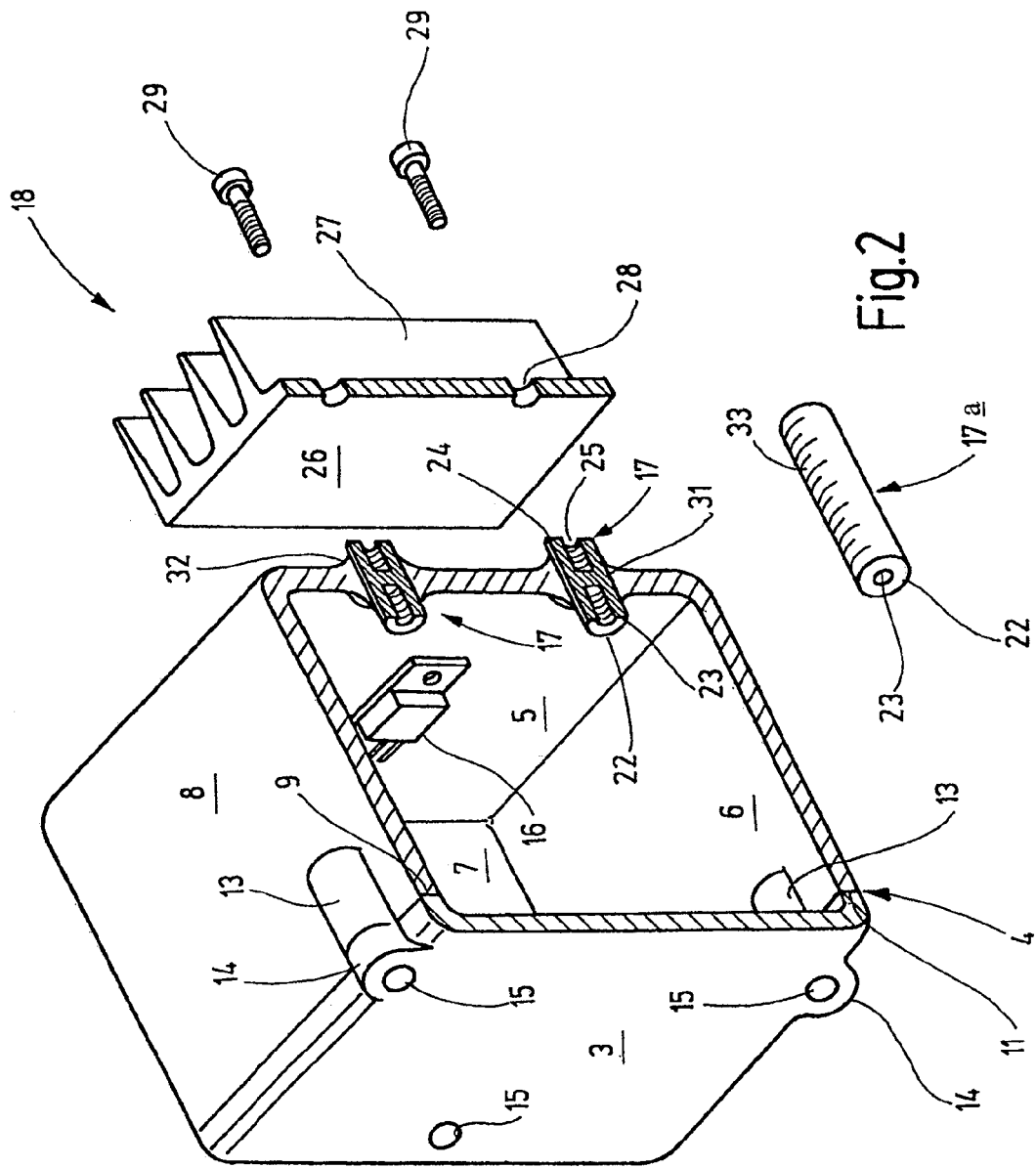
FIG. 2, a representation similar to FIG. 1, of an alternative embodiment with a different variation of the thermal bridge.

FIG. 2 shows another embodiment of the thermal bridges 17. In this case, the thermal bridges consist of individual cylindrical bolts 17a that are inserted into corresponding through-bores 31 in the housing rear wall.

FIG. 2 shows a housing in a form similar to that of FIG. 1. In contrast to FIG. 1, it is assumed that the housing wall has an inferior thermal conductivity, for example, because the housing wall 5 consists of a fiber-reinforced plastic material. In order to still dissipate heat outwardly through such a relatively well-insulating material, the aforementioned through-holes 31 are provided in the housing rear wall 5. It suffices to merely provide these openings if the housing rear wall has a corresponding material thickness. However, if the material thickness is insufficient, it is advantageous to provide the housing rear wall 5 with thickened portions 32 in the shape of truncated cones in the vicinity of the bores 31, as shown in FIG. 2. The thermal bridge 17, for example, in the form of a copper bolt is inserted into this opening 31 in a sealed fashion. As illustrated in the enlarged detail, this can be effected by providing the copper bolts 17a with an external thread 33 that engages a corresponding internal thread in the bore 31.

The copper bolt again has the blind holes 23, 25 for rigidly screwing and securing on the heat-generating semiconductor 16. If a uniform height is desired, the copper bolts 17 are machined on the face side as described following the insertion.

As another variation, it is possible to insert the thermal bridge 17 in the form of a bolt into a smooth opening 31 and to tighten the bolt against the housing with corresponding nuts from both sides. In that case, however, the surfaces adjacent to the through-opening have to be processed accordingly. Such a preparation is not required if the thermal bridge 17 is screwed into a corresponding thread and adhered therein. It suffices to process the thermal bridges 17 on the face sides after the adhesion or securement process in order to produce the mounting faces.

From the foregoing, it can be seen that a hermetically sealed or protective housing is provided that has heat dissipation thermal bridges at discrete points. The thermal bridges form mounting faces in the interior of the housing, as well as mounting faces on the outer side. Heat from the interior of the housing is dissipated outwardly at the corresponding points via the thermal bridges.

The invention claimed is:

1. A protective housing of the Ex-d or powder filling type comprising:
   housing walls (3, 5, 6, 7, 8) that surround a closed interior,
   a thermal bridge (17) on one of said housing walls,
   said thermal bridge including an inner elevation (19) on the one housing wall (5) that protrudes inwardly from the housing wall (5) and is formed with a mounting face (22) for a component (16) to be cooled, and
   an outer elevation (21) that protrudes outwardly from the one housing wall (5), said inwardly and outwardly protruding elevations (19,21) lying on a common axis that extends perpendicular to the one housing wall (5), and said outwardly protruding elevation having a mounting face (25) for a cooling element (18).

2. The housing according to claim 1 in which has at least one of said housing walls (3, 5, 6, 7, 8) has substantially planar surfaces.

3. The housing according to claim 1 in which said housing (1) has a cuboid shape.

4. The housing according to claim 1 in which said one housing wall (5) is made of a thermal conductive material for transmitting heat from said inner protrusion to said outer protrusion.

5. The housing according to claim 1 in which said thermal bridge (17) is formed by a bolt that extends through said one housing wall (5), said bolt forming the inner elevation with one end and the outer elevation with another end.

6. The housing according to claim 1 in which said bolt (17) extends from an opening (31) in the one housing wall (5) to form an Ex gap.

7. The housing according to claim 6 in which said bolt (17) is screwed into a threaded bore (31) of said opening.

8. The housing according to claim 1 in which said elevations (19, 21) are formed integrally with the one housing wall (5).

9. The housing according to claim 1 in which said inner and the outer elevations (19, 21) each have the shape of a truncated cone or a truncated pyramid.

10. The housing according to claim 9 in which said elevations (19, 21) each have base cross sectional areas larger than their respective mounting faces.

11. The housing according to claim 1 in which said elevations (19, 21) are congruently arranged on the one housing wall (5).

12. The housing according to claim 1, characterized by the fact in which at least one of said mounting faces (22, 25) is a planar face.

13. The housing according to claim 12 in which said planar face (22, 25) lies parallel to a plane defined by the one housing wall (5).

14. The housing according to claim 1 in including a plurality of said thermal bridges (17) in said one housing wall (5).

15. The housing according to claim 14 in which said thermal bridges (17) blend into one another.

16. The housing according to claim 14 in which the outer protrusions of a plurality of said thermal bridges (17) have respective mounting faces (25) that lie in a common plane.

17. The housing according to claim 14 in which the inner protrusion of said plurality of thermal bridges (17) have respective mounting faces (19) that lie in a common plane.

18. The housing according to claim 14 in which mounting faces (19, 21) each is formed with a threaded bore (22, 25).

19. The housing according to claim 18 in which said threaded bores (22, 25) each is formed in a blind hole.

* * * * *